United States Patent
Mikhaylichenko et al.

(10) Patent No.: US 8,440,573 B2
(45) Date of Patent: May 14, 2013

(54) METHOD AND APPARATUS FOR PATTERN COLLAPSE FREE WET PROCESSING OF SEMICONDUCTOR DEVICES

(75) Inventors: Katrina Mikhaylichenko, San Jose, CA (US); Denis Syomin, San Jose, CA (US); Qian Fu, Fremont, CA (US); Glenn W. Gale, Tokyo (JP); Shenjian Liu, Fremont, CA (US); Mark H. Wilcoxson, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 586 days.

(21) Appl. No.: 12/694,134

(22) Filed: Jan. 26, 2010

(65) Prior Publication Data

US 2011/0183522 A1    Jul. 28, 2011

(51) Int. Cl.
*H01L 21/302* (2006.01)

(52) U.S. Cl.
USPC ............... 438/719; 438/9; 438/710; 438/745; 438/753; 438/906; 216/59; 216/67; 216/84; 216/96; 216/99; 134/1.2; 134/1.3

(58) Field of Classification Search ......................... None
See application file for complete search history.

(56) References Cited

U.S. PATENT DOCUMENTS

| | | | |
|---|---|---|---|
| 6,068,911 A | 5/2000 | Shouji et al. | |
| 6,605,413 B1 | 8/2003 | Lyons et al. | |
| 6,849,389 B2 | 2/2005 | Mahorowala | |
| 7,229,936 B2 | 6/2007 | Brodsky et al. | |
| 2001/0037994 A1 | 11/2001 | Ezaki | |
| 2003/0017420 A1 | 1/2003 | Mahorowala | |
| 2004/0092126 A1* | 5/2004 | Yang et al. | 438/725 |
| 2004/0198066 A1 | 10/2004 | Verhaverbeke | |
| 2004/0216772 A1* | 11/2004 | Xu et al. | 134/36 |
| 2005/0224457 A1 | 10/2005 | Satake et al. | |
| 2006/0057507 A1 | 3/2006 | Chang et al. | |
| 2006/0223318 A1* | 10/2006 | Tagawa | 438/689 |
| 2009/0104347 A1 | 4/2009 | Van Benthem et al. | |
| 2011/0189858 A1* | 8/2011 | Yasseri et al. | 438/694 |
| 2012/0135604 A1* | 5/2012 | Ohto et al. | 438/694 |

FOREIGN PATENT DOCUMENTS

| | | |
|---|---|---|
| JP | 2011-151114 | 8/2011 |
| WO | WO 2011/094038 | 8/2011 |

OTHER PUBLICATIONS

International Search Report dated Oct. 19, 2011 from International Application No. PCT/US2011/020283.
Written Opinion dated Oct. 19, 2011 from International Application No. PCT/US2011/020283.
Chen et al., "Super-hydrophobic and/or Super-hydrophilic Surfaces Made by Plasma Process," NSTI-Nanotech 2009 Technical Proceedings 1-3, 194-197 (2009).

* cited by examiner

*Primary Examiner* — Anita Alanko
(74) *Attorney, Agent, or Firm* — Beyer Law Group LLP

(57) ABSTRACT

A method is provided for processing a wafer used in fabricating semiconductor devices. The method can comprise forming high-aspect ratio features on the wafer, which is followed by wet processing and drying. During drying, pattern collapse can occur. This pattern collapse can be repaired to allow for additional processing of the wafer. In some instance, pattern collapse can be repaired via etching where the etching breaks bonds that can have formed during pattern collapse.

20 Claims, 4 Drawing Sheets

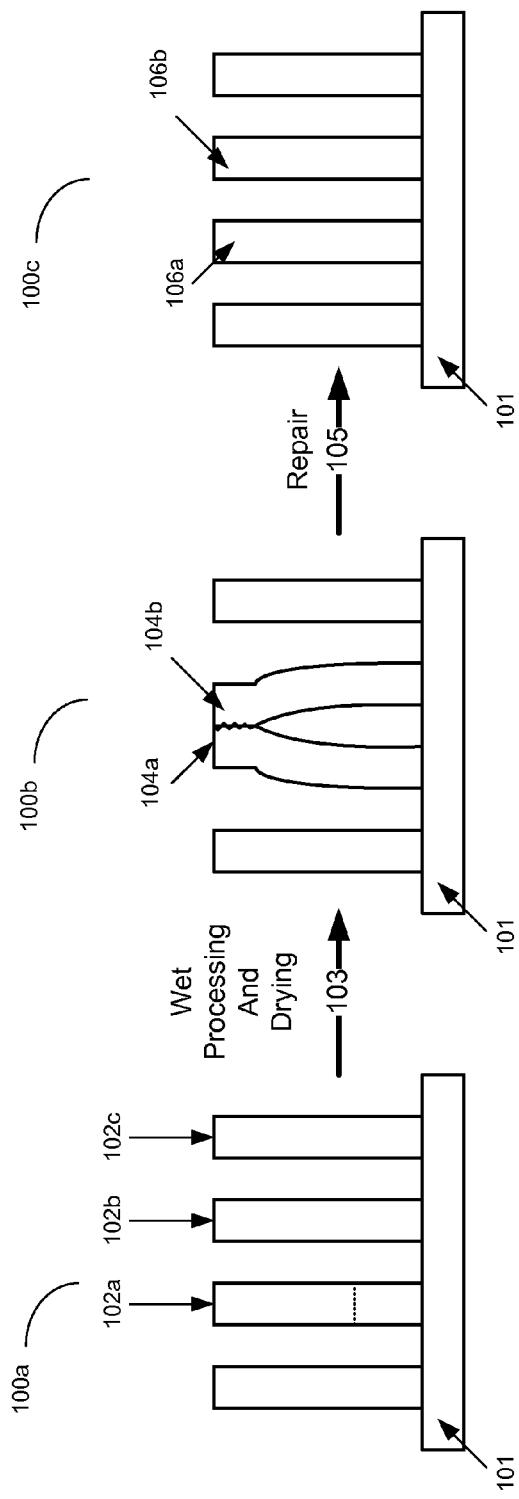
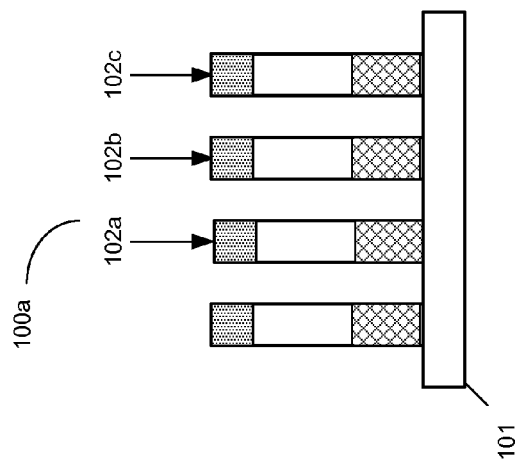
FIGURE 1A
FIGURE 1B

METHOD AND APPARATUS FOR PATTERN COLLAPSE FREE WET PROCESSING OF SEMICONDUCTOR DEVICES

BACKGROUND OF THE INVENTION

1. Field of the Invention

The invention relates to semiconductor devices. More specifically, the invention relates to the production of semiconductor devices where wet chemical treatment processes are used on high aspect ratio nanostructures on a wafer.

2. Description of the Related Art

During the fabrication of semiconductor devices, features are etched into a stack of materials (conductors and/or dielectric insulators) on silicon wafers. Also during the fabrication, the wafers are subjected to wet processing and then a drying process. The wet processing may include wet cleaning. The drying can include evaporative drying, IPA assisted drying, spin drying, etc.

SUMMARY OF THE INVENTION

To achieve the foregoing and in accordance with the purpose of the present invention methods of processing a wafer used in fabricating semiconductor devices is provided. The method can be generally characterized as comprising: 1) forming multiple high aspect ratio features in a layer on the silicon wafer; 2) performing wet processing of the wafer; 3) subsequently drying the wafer; and 4) repairing pattern collapse among the multiple high aspect ratio features. The forming of the multiple high aspect ratio features can comprise forming a photoresist patterned mask over the silicon based layer and etching the high aspect ratio features into the silicon based layer. In addition, the forming of the multiple high aspect ratio features can further comprise stripping the photoresist patterned mask. The multiple high aspect ratio features can comprise a top layer of SiN on top of an oxide layer, such as not limited to TEOS.

In particular embodiments, an aspect ratio of at least a portion of the multiple high aspect ratio features can be 10 to 1 or greater. A characteristic dimension of the features can be less than 40 nm (nanometer), such as a width of the features. In other embodiments, the characteristic dimension can be less than 30 nm. The multiple high aspect ratio features can be formed using a dry etching process or using a wet etching process. Further, the repairing of the pattern collapse can be performed using a dry etching process where the dry etching process includes an STI etch of a silicon based layer. In addition, the repairing of the pattern collapse can be performed using a wet etching process. The wet etching can include an HF etch.

In yet other embodiments, the repairing can break bonds formed between adjacent features during drying. The multiple high aspect ratio features can comprise a top SiN layer where the bonds are formed in the SiN layer. The drying of the wafer can comprise controlled drying, uncontrolled drying or combinations thereof. For instance, the drying of the wafer can comprise controlled drying with active suction of a fluid applied to the wafer.

In other embodiments, the wet processing of the wafer can comprise a wet cleaning process. The wet cleaning process can comprise a Hard Mask Open (Clean) performed after an HMO etch. Further, the multiple high aspect ratio features can be formed using an HMO etch. Queue time control can be applied between an end of the wet processing and the repairing of the pattern collapse to ensure the repairing is performed within a specific time period after the end of the wet processing. The repairing of the pattern collapse can be combined with additional etching to be performed on the wafer after the drying of the wafer.

Another aspect provides a method of processing a photoresist mask used in fabricating semiconductor devices. The method can be generally characterized as comprising: a) forming a photoresist layer; b) performing wet processing of the photoresist layer to develop a photoresist layer pattern with multiple high aspect ratio features; c) subsequently drying the photoresist mask causing pattern collapse; and d) repairing pattern collapse among the multiple high aspect ratio features.

Another aspect provides a method of fabricating capacitor structures (supported or non-supported) used in fabricating semiconductor devices. The method can be generally characterized as comprising: a) forming a high aspect ratio contact holes in oxide film; b) depositing a TiN layer; c) subsequently removing oxide layer with wet etching chemistry leaving free standing high aspect ratio cylindrical structures; d) drying the high aspect ratio cylinder structures causing cylinder leaning, i.e., pattern collapse; and e) repairing the pattern collapse among the high aspect ratio cylinder structures by performing plasma etching.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 1A and 1B are cross-sectional views of features on a wafer after a number of different processing steps for an embodiment of the present invention.

DETAILED DESCRIPTION OF THE PREFERRED EMBODIMENTS

Figure 2:
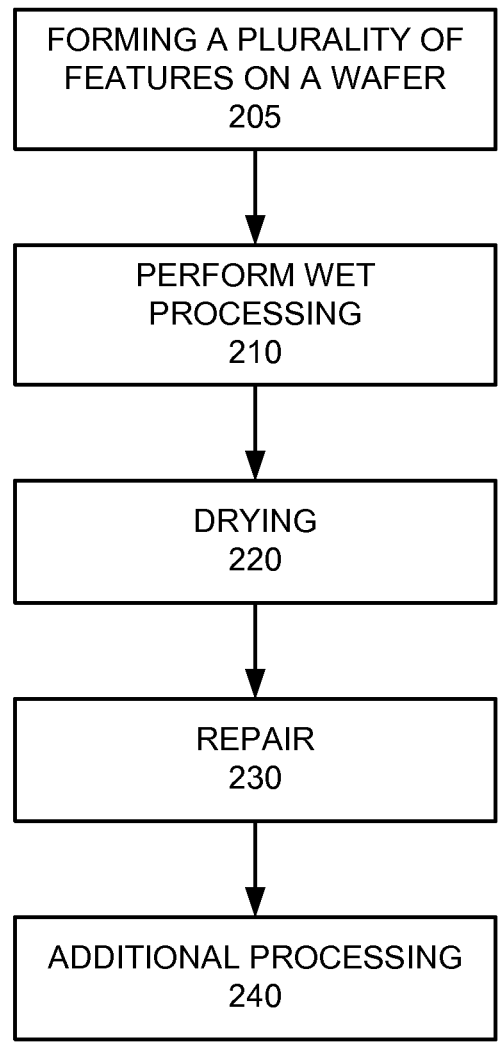
FIG. 2 is a flow chart of an embodiment of the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In a typical semiconductor device fabrication process, a wafer undergoes various processes including, for example, depositing layers of silicon based material, depositing photoresist masks, etching, wet cleaning and drying. With respect to the fabrication process, silicon based layers can be used to describe layers that comprise silicon. Examples of the silicon based materials used include silicon dioxide and silicon nitride. The process of etching can be used to create extremely small features, such as nanostructures, within the layers of silicon based materials deposited on the wafer substrate. Extremely small features can also be created during processing of the photoresist masks.

With appropriate fabrication steps, the size of the features can be decreased to improve the density of features on the wafer. As feature sizes decrease, aspect ratios of the features increase, often in the range of 10:1 to 12:1 or higher. This can lead to the problem of the features collapsing when the wafers are subjected to wet chemical treatments, such as wet cleaning followed by drying. This problem is not limited to processing of silicon based materials but can also occur when photoresist masks are processed. The aspect ratio at which feature collapse occurs can depend upon the material properties of which a structure is constructed. Further, whether feature collapse occurs or not can depend on the type of wet processing that is performed subsequent method of drying that is employed.

As an example, feature collapse often occurs during wet cleaning and subsequent drying. Fluid enters the spaces between features and capillary forces involving surface tension can be large enough to alter and/or damage the delicate nanostructures. The generated forces resulting from the drying liquid can pull surfaces of adjacent features into contact. These forces can lead to the collapse of the features individually or the alteration of features through bridging. Bridging occurs when at least two adjacent features collapse against one another and become adhered together. The sidewalls of adjacent structures can adhere together, or a residue material may gather between the structures, joining them together. Feature collapse can be a significant problem in semiconductor fabrication and can lead to defects in the circuits produced.

Some methods of reducing feature collapse have been explored. Examples include, rinsing with a low surface tension liquid such as liquid isopropyl alcohol, supercritical carbon dioxide drying, and drying with rinse liquids at elevated temperatures. Some of these techniques have met with limited success; however, such techniques are costly and often require elaborate setups. For example, supercritical carbon dioxide requires high pressures to go beyond the critical point.

In the past, standard practice has been to not repair feature collapse that can occur after wet processing and drying. When wet processing steps have been utilized that result in feature collapse after drying, the approach has been to change the preceding processing steps, such that pattern collapse is not observed after drying. Some of these steps, as described above, such as the use of supercritical $CO_2$ can be quite costly. Nevertheless, the typical approach has been to prevent feature collapse rather than repair it. As is described in more detail with respect to the following figures, in some instances, after wet processing and drying produce feature collapse, it can be possible to repair the feature collapse with additional processing.

FIG. 1A is cross-sectional views of feature structures after a number of different processing steps for an embodiment of the present invention. Three patterns of features, 100a, 100b and 100c after various processing steps are shown. After one or more initial processing steps, features 102a, 102b and 102c on pattern 100a can be generated on a substrate 101. The features can be on the order of 32 nm or less. Although shown as equal, the spacing between features can vary between different adjacent features. Thus, for instance, the spacing between features 102a and 102b can be different than the spacing between features 102b and 102c. As will be discussed below, the spacing between features can be a factor in producing pattern collapse.

The features, such as 102a, 102b and 102c in pattern 100a can comprise multiple layers with different material compositions. For example, as is shown in FIG. 1B, feature 102a-102c is illustrated with 3 layers. In one embodiment, the top layer can comprise SiN (Silicon Nitride), the second layer can comprise a TEOS (Tetraethyl Ortho silicate) and the third layer closest to the substrate 101 can comprise SiN. In particular embodiments, SiN can be deposited over an oxide layer. Thus, the structure does not have to include 3 layers. A pattern, such as 100a, with features comprising SiN-TEOS and SiN, can be generated after a Hard Mask Open (HMO) etch. In general, the pattern 100a can be formed using a dry etch, a wet etch or combinations thereof. In other embodiments, features 102a, 102b and 102c, can comprise a single layer, such as single layer of photoresist material where the features 102a, 102b and 102c are formed after developing a photoresist pattern formed in the photoresist layer.

In some step, after pattern 100a is formed, wet processing and drying 103 can be applied to pattern 100a. The wet processing can be a wet etching step, a cleaning step or combinations thereof. The wet processing can be followed by drying. The drying process can involve uncontrolled drying, such as the evaporation that naturally occurs after being removed from wet processing at room conditions and controlled drying, where the drying process is controlled using suction, wafer spinning and other fluids and vapors to modulate surface tension.

Pattern collapse can refer to unintended contact between adjacent features after wet processing and drying, such as in 103. In particular, the contact can occur during drying and remain after drying is complete. As an example, pattern 100b shows contact between adjacent features 104a and 104b. Below the contact, the underlying features of the pattern are not destroyed, rather the features have been deformed, i.e., they have been bent towards one another to form a contact. In various embodiments, as is discussed further below, it has been observed that under certain conditions, this deformation is elastic in that can be reversed to a significant extent.

When the features, such as 104a and 104b comprise multiple layers, the contact between adjacent features can be primarily confined to one of the layers, such as a top most layer. For instance, in the example of SiN-TEOS—SiN structure, the contact may be observed primarily in the top most SiN layer of features 104a and 104b. Both, the fraction of lines in contact with each other and the area of contact for two adjacent lines for each incidence of collapse can depend on the material strength for each of the one or more layers, the thickness and aspect ratios of the various features and the dynamics of the drying process that is employed. The amount of contact between adjacent features can be measured on a sample wide basis. Thus, the amount of contact between adjacent features can refer to the overall contact between all the lines in a sample.

In 103, during wet processing and subsequent drying, surface tension in the spaces between features can result in forces that tend to pull together features and can result in pattern collapse. Spacing variations, between adjacent features, can lead to unequal surface tension related forces acting on adjacent lines as the surface tension force is proportional to the spacing Also, the spacing variations can lead to variations in the liquid levels between adjacent features. The spacing variations and unequal liquid levels can produce unequal forces with both uncontrolled and controlled drying.

The liquid level in a space between features and the spacing itself affect a radius of curvature of liquid meniscus formed in the space. The radius of curvature variations change the forces exerted on adjacent features as a result of surface tension in the liquid. These unequal forces can produce bending in features, which produces further spacing variations exacerbating, the problem. In addition, drying parameters, such as a speed of drying and a uniformity of a wet-dryinterface, when active drying is used, affects liquid levels and evaporation rates in the columns between features, which again can result in force imbalances. Finally, pattern geometry, such as the size aspect ratios and shape of various features can affect the forces balances that can lead to pattern collapse.

In one embodiment, wet processing, such as cleaning and active drying in 103, can be performed using Confined Chemical Cleaning (C3) technology developed by LAM Research Corporation™ of Fremont, Calif. In Confined Chemical Cleaning, the wafer goes through the meniscus of fluid contained by balanced liquid flow and vacuum suction. Typical sequence includes chemical treatment followed by Deionized Water rinse. In particular embodiments, a drying interface can be formed using Deionized Water (DIW) and Isopropyl alcohol (IPA) where an IPA vapor is applied at the suction boundary to control surface tension during drying.

After pattern collapse, such as in pattern 100b, a repair step can be applied to pattern 100b to generate a pattern, such as 100c, that is closer to the pattern 100a that was generated prior to the wet processing of pattern 100a. In one embodiment, the repair step can comprise etching the pattern exhibiting pattern collapse, such as pattern 100b. The etching can involve dry or wet etching. Dry etching can involve plasma etching involving a plasma processing chamber that is described with respect to FIG. 4a. For instance, when the top layer comprises, SiN the dry etching can be used to trim a portion of this layer. An example of a wet etch could be the application of HF (Hydrogen Fluoride) to a layer, such as an oxide layer. Whether wet or dry etching is used can depend upon the composition of the layer or layers for which contact between adjacent features has occurred.

It is believed that by removing material, such as by etching, the bonds at contact surfaces between adjacent features can be broken in the features exhibiting pattern collapse. If the bonds are broken in the repair step and the deformation of the features involved in the pattern collapse is sufficiently elastic, then features, such as 104a and 104b shown as bent towards one another in pattern 100b, after repair, can recover to features, 106a and 106b as shown in pattern 100c. Features, such as 106a and 106b in pattern 100c are comparable to their original structure as shown with respect to pattern 100a. The features in pattern 100a as compared to 100c are not necessarily identical. For instance, when etching is applied in the repair step 105, a top portion of the features, such as 106a and 106b that exhibited pattern collapse as well as a top portion of the features not involved in the pattern collapse can be removed. Nevertheless, the repair can be sufficient to allow continued processing of the wafer after the repair in 105.

In some embodiments, the repair step 105 can be time dependent. For instance, after a certain time period, the pattern collapse, such as illustrated in the deformation of features 104a and 104b in pattern 100b, may not be reversible enough to allow continued processing of the wafer. For instance, for certain features comprised of one or more material layers, it is believed that the bond strengths between adjacent features that are collapsed can increase with time, such as via diffusion of materials through the contact, the contact area between adjacent features can increase or the deformation can transition from an elastic mode that is reversible to a non-reversible plastic mode. Each of these effects can be dependent on the materials from which the features are constructed as well as the nature and extent of the collapse.

As an example, a SiN trim by plasma etching was performed as a repair step 105 on a wafer exhibiting pattern collapse. A trim, such as the SiN trim, can be described as an etching process that primarily etches the outer layer of the feature without significantly etching the underlayer. It was observed that if the trim was applied within a first time period, the resulting structure was pattern collapse free, such as applying the repair step 105 within ½ hour of wet processing. When the repair step was performed within 2 hours, isolated instances of pattern collapse were detected after the repair step. After 7 hours, pattern collapse was observed in 20-30% of lines of the repair step. After 24 hours, pattern collapse was observed in greater than 40% of the lines.

The decline in the ability of the repair step to reverse pattern collapse can be dependent on the materials used, the wet processing performed and the drying performed. Thus, these times can vary. In some instances, the ability to reverse pattern collapse was successful for times greater than 24 hours when different materials and processes were employed.

FIG. 2 is a flow chart of an embodiment of the invention. In 205, multiple features are formed on a wafer. These features can have been formed using a number of processing steps. In one embodiment, the formed features can have a dimension, such as a line width, of less than 40 nm and space width of less than 40 nm. In 210, a wet process can be performed on the wafer. The wet processing can be a cleaning step. After wet processing, in 220, drying can be performed on the wafer. The drying can be performed in a controlled or uncontrolled manner. In 230, a repair step can be performed to reverse pattern collapse that is observable after drying. The repair step can be a wet etch or a dry etch. After the repair step 230, additional processing can be performed on the wafer.

Between steps 220 and 230, queue time control can be employed. As previously described, after drying, the repair step may only be affective for a limited time period. Thus, queue time control can be employed to insure that the repair step is performed within some time period.

In one embodiment, in 205, the plurality of features can be fabricated using a HMO (Hard mask open) etch followed by an HMO clean. The HMO clean can be performed using a cleaning solution, such as Confined Chemical Cleaning™ (C3) (Lam Research, Fremont Calif.) with DIW. A repair step can be applied to repair damage from drying. The repair step can comprise etching, such as a Shallow Trench Isolation (STI) etch. Additional processing, such as an STI etch and STI clean can be applied after the repair step. In particular, an STI clean can be performed using Confined Chemical Cleaning™ (C3) with HF. In one embodiment, the STI etch can performed using a Kiyo™ etching product, a plasma etching apparatus, produced by Lam Research (Fremont, Calif.).

In one embodiment, repair step and the additional processing steps can be combined. For instance, the repair step can be combined with an additional etching step, such an STI etch that is scheduled to be performed. Thus, part of the STI etch would accomplish pattern collapse repair and another part of the STI etch would accomplish the additional processing needed on the wafer. Again, after wet processing queue time control can be employed to ensure the etch is performed within a time period during which pattern collapse is reversible.

In another embodiment, an STI etch can be performed in 205 followed by an STI clean. Then, as a repair step, a wet etch comprising HF etching can be performed. The HF etch can be employed to wet etch an oxide structure. In yet other embodiments, during processing multiple wet processing steps, followed by drying and repair steps can be performed. For instance, a first etch, followed by cleaning and drying and then repair can be performed. Then, a second etch, followed by cleaning and drying and a repair step can be performed.

In another embodiment, pattern collapse repair can be used as part of a method of fabricating capacitor structures used in semiconductor devices. The capacitor structures can be supported or unsupported. The method can be generally characterized as comprising: a) forming a high aspect ratio contact holes in an oxide film; b) depositing layer, such as a TiN layer; c) subsequently removing oxide layer with wet etching chemistry leaving free standing high aspect ratio structures, such as cylindrical structures; d) drying the high aspect ratio free standing structures; and e) repairing pattern collapse among the multiple high aspect ratio free standing structures by performing plasma etching. In this example, after drying a portion of the high aspect ratio free standing structure can be leaning and in contact with one another, i.e., a portion of the pattern can be collapsed. This pattern collapse can be repaired using plasma etching.

Figure 3:
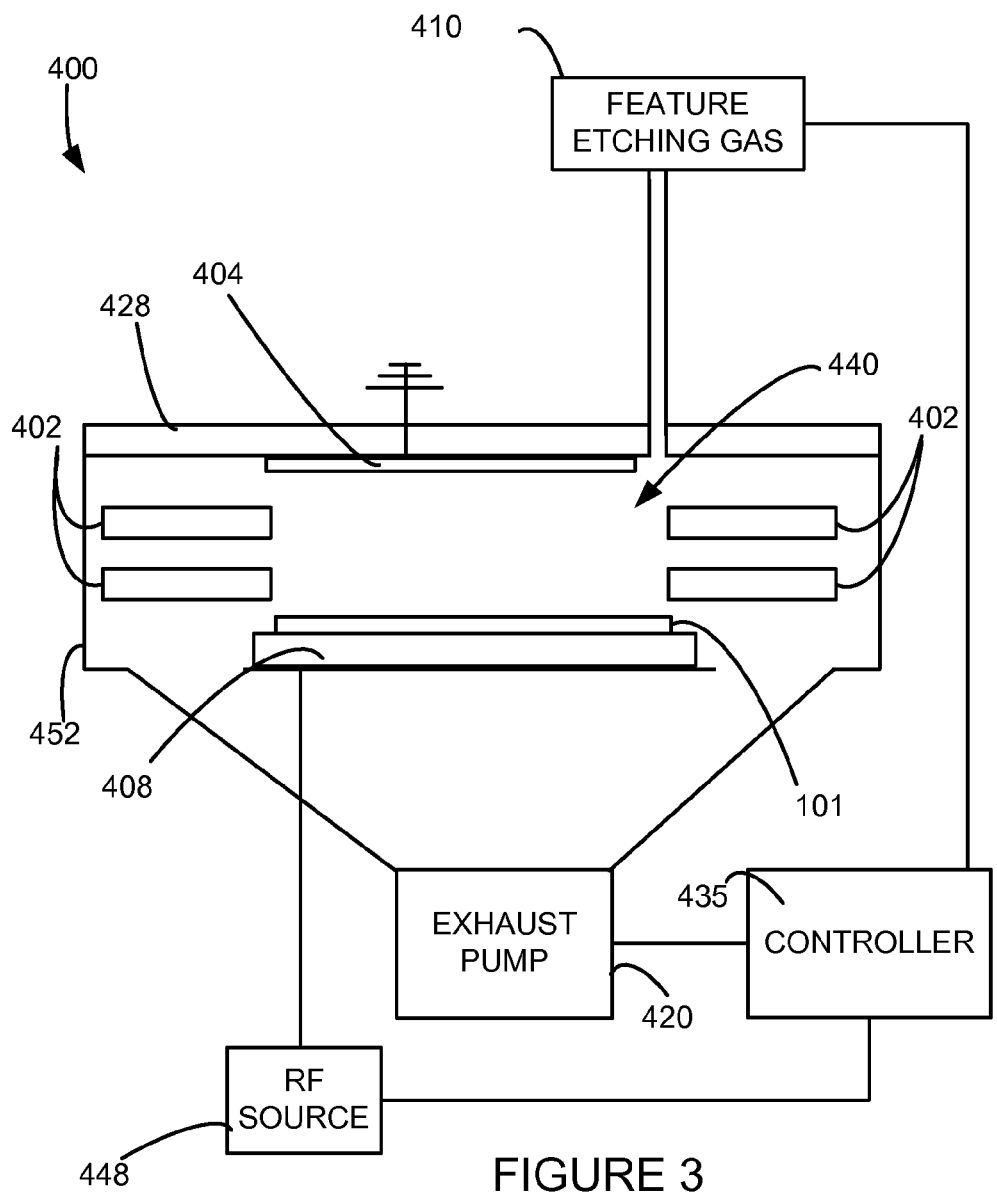
FIG. 3 is a schematic view of a process chamber that may be used in an embodiment of the invention.

FIG. 3 is a schematic view of a plasma processing chamber 400 that may be used for etching the features or repair of collapsed features in this example. The plasma processing chamber 400 comprises confinement rings 402, an upper electrode 404, a lower electrode 408, a gas source 410, and an exhaust pump 420. The gas source 410 may comprise multiple gas sources. Within plasma processing chamber 400, the substrate 101 is positioned upon the lower electrode 408. The lower electrode 408 incorporates a suitable substrate chucking mechanism (e.g., electrostatic, mechanical clamping, or the like) for holding the substrate 101. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume 440 by the gas source 410 and is exhausted from the confined plasma volume 440 through the confinement rings 402 and an exhaust port by the exhaust pump 420. An RF source 448 is electrically connected to the lower electrode 408. The upper electrode 404 is grounded. Chamber walls 452 surround the confinement rings 402, the upper electrode 404, and the lower electrode 408. The RF source 448 may comprise a 27 MHz power source and a 2 MHz power source, and a 60 MHz power source. An Exelan 2300™, which is made by LAM Research Corporation™ of Fremont, Calif., was used in this example of the invention. Different combinations of connecting RF power to the electrode are possible in other embodiments, such as having an RF source connected to the upper electrode 404.

In one embodiment, an integrated machine can be used for clean and etch processes. The integrated machine may allow for better queue time control. An integrated machine may be beneficial when needed queue time is short. The machine can be programmed with software that detects the queue times associated with lots as they are processed. The software can compare queue times for each lot associated with specified queue time limits, such as a queue time limit after which pattern collapse repair is no longer considered viable. The software can be configured to flag a lot for which the queue time is violated.

Further, in other embodiments, pattern collapse repair can be queue time dependent. For example, a longer queue time can require a longer trim time to repair pattern collapse as compared to a short queue time. The integrated machine can be configured to adjust trim times based upon a detected queue time for a particular lot. This type of methodology, i.e., determining etching time based upon queue time, can also be applied for non-integrated machines.

Figure 4A:
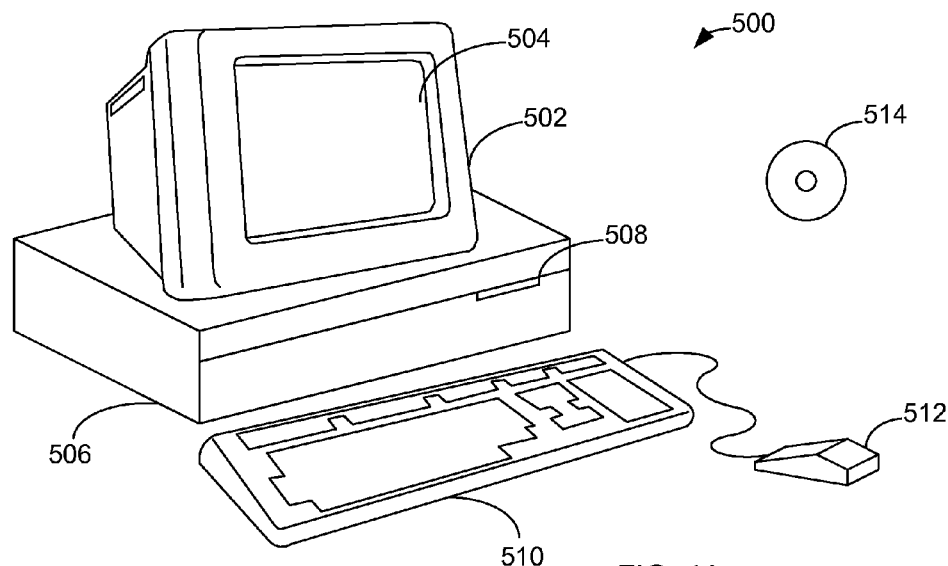
FIGS. 4A and 4B illustrate a computer system, which is suitable for implementing a controller.
Figure 4B:
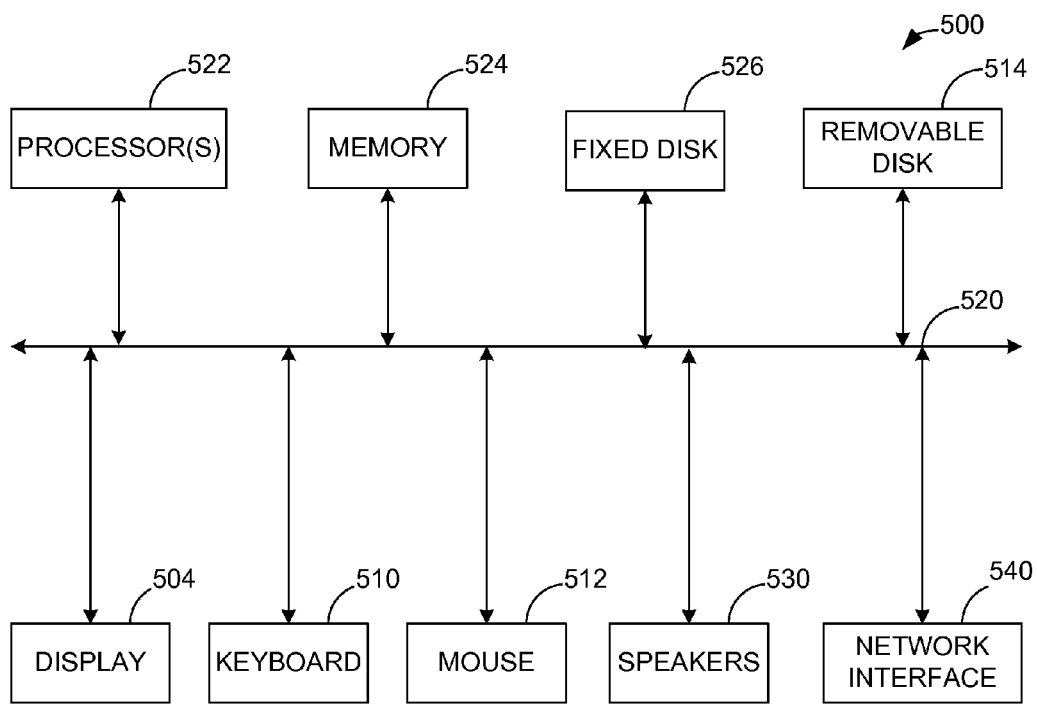

FIGS. 4A and 4B illustrate a computer system 500, which is suitable for implementing a controller 435 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

FIG. 4B is an example of a block diagram for the computer system 500. Attached to system bus 520 is a wide variety of subsystems. Processor(s) 522 (also referred to as central processing units or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of any of the computer-readable media described below.

CPU 522 is also coupled to a variety of input/output devices, such as display 504, keyboard 510, mouse 512 and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method of processing a wafer used in fabricating semiconductor devices, said method comprising:
    forming multiple high aspect ratio features in a layer on the wafer;
    performing wet processing of the wafer;
    subsequently completely drying the wafer which causes pattern collapse; and thereafter
    repairing by etching at least 60% of the pattern collapse among the multiple high aspect ratio features, wherein a high aspect ratio comprises an aspect ratio of at least ten to one.

2. The method of claim 1 wherein the forming of the multiple high aspect ratio features comprises:
forming a photoresist patterned mask over a silicon based layer;
plasma etching the high aspect ratio features into the silicon based layer.

3. The method of claim 2 wherein the forming of the multiple high aspect ratio features further comprises stripping the photoresist patterned mask.

4. The method of claim 3, wherein an aspect ratio of at least a portion of the multiple high aspect ratio features is 10 to 1 or greater.

5. The method of claim 4, wherein a characteristic dimension of the portion of the multiple high aspect ratio features is less than 40 nm.

6. The method of claim 4, wherein the repairing of the pattern collapse comprises a dry trimming process.

7. The method of claim 6, wherein the repairing the pattern collapse further comprises an etch of a silicon based layer.

8. The method of claim 7, wherein the etch is an STI etch.

9. The method of claim 4, wherein the repairing of the pattern collapse is performed using a wet etch trimming process.

10. The method of claim 9, wherein the wet etch trimming process includes an HF etch.

11. The method of claim 1, wherein the repairing breaks bonds formed between adjacent features during drying.

12. The method of claim 11, wherein the multiple high aspect ratio features comprise a top SiN layer and the bonds are formed in the SiN layer.

13. The method of claim 1, wherein the wet processing of the wafer comprises a wet cleaning process.

14. The method of claim 1, further comprising applying queue time control between an end of the wet processing and the repairing of the pattern collapse to ensure the repairing is performed within a specific time period after the end of the wet processing.

15. The method of claim 1, wherein the multiple high aspect ratio features comprise a top layer of SiN, a middle layer of TEOS and a bottom layer of SiN.

16. The method of claim 1, wherein the layer is a photoresist layer and the wet processing is used to develop a photoresist layer pattern including the multiple high aspect ratio features.

17. A method of processing a wafer used in fabricating semiconductor devices, said method comprising:
forming a photoresist patterned mask over a silicon based layer;
plasma etching multiple high aspect ratio features into the silicon based layer wherein an aspect ratio of at least a portion of the multiple high aspect ratio features is 10 to 1 or greater and wherein a characteristic dimension of the portion of the multiple high aspect ratio features is less than 30 nm;
performing wet processing of the wafer;
subsequently completely drying the wafer which causes pattern collapse; and thereafter
repairing by etching at least 60% of the pattern collapse among the multiple high aspect ratio features using a trimming process.

18. The method of claim 17, the repairing breaks bonds formed between adjacent features during drying.

19. The method of claim 17, wherein the wet processing of the wafer comprises a wet cleaning process.

20. The method of claim 17, further comprising applying queue time control between an end of the wet processing and the repairing of the pattern collapse to ensure the repairing is performed within a specific time period after the end of the wet processing.

\* \* \* \* \*